US006928599B2

United States Patent
Edlis et al.

(10) Patent No.: US 6,928,599 B2
(45) Date of Patent: Aug. 9, 2005

(54) METHOD AND APPARATUS FOR DECODING DATA

(75) Inventors: Ophir Edlis, Modiin (IL); Sharon Levy, Givatayim (IL); Erez Schwartz, Kfar Saba (IL); Gadi Mazuz, Shoham (IL); David Deitcher, Ra'anana (IL); Noam Mizrahi, Tel Aviv (IL)

(73) Assignee: Intel Corporation, Santa Clara, CA (US)

( * ) Notice: Subject to any disclaimer, the term of this patent is extended or adjusted under 35 U.S.C. 154(b) by 486 days.

(21) Appl. No.: 10/002,405

(22) Filed: Dec. 5, 2001

(65) Prior Publication Data

US 2003/0106007 A1 Jun. 5, 2003

(51) Int. Cl.⁷ .......................... H03M 13/00; H03D 1/00
(52) U.S. Cl. ........................................ 714/752; 375/341

(58) Field of Search ................................ 714/752, 755, 714/746, 747, 759; 375/341, 259, 262, 265; 382/232

(56) References Cited

U.S. PATENT DOCUMENTS

| 5,933,462 A | * | 8/1999 | Viterbi et al. | ................ 375/341 |
| 6,289,486 B1 | * | 9/2001 | Lee et al. | .................... 714/788 |

* cited by examiner

*Primary Examiner*—Guy J. Lamarre
*Assistant Examiner*—James C Kerveros
(74) *Attorney, Agent, or Firm*—Pearl Cohen Zedek; Latzer, LLP

(57) ABSTRACT

Decoding an encoded block of data is accomplished by partitioning the block into a first and a second sub-block and performing forward and backward iterative calculations on the sub-blocks in separate processes. Based on results of the iterative calculations an output matrix may be calculated for each sub-block. The outputs may be combined.

32 Claims, 4 Drawing Sheets

US 6,928,599 B2

METHOD AND APPARATUS FOR DECODING DATA

FIELD OF THE INVENTION

The present invention relates generally to the field of decoding encoded digital data. More specifically, the present invention relates to a system and method for performing bi-directional or multi-phase decoding of a block of error correction encoded data.

BACKGROUND OF THE INVENTION

A transmitter in a mobile communication system may have an error correction coder to perform error correction coding (e.g. convolutional coding) of data to be transmitted. A receiver in such a system may contain a decoder (e.g. Viterbi decoder) to decode the error correction coded data and to recover the original data. There are many well known coding and decoding methodologies, including turbo coding add decoding. Turbo decoders, among others, may utilize a two phase process for decoding all encoded data block having N elements, a forward phase and a backward phase. Each phase may be calculated recursively, the forward phase generating a forward state matrix and the backward phase generating a backward state mat. An element from the forward state matrix, $\alpha_n$, may be calculated from a previously calculated element, $\alpha_{n-1}$, and an element for the backward state matrix, $\beta_n$, may be calculated from a numerically successive element $\beta_{n+1}$. The posteriori probability estimation related to element n is based on combining the information gained from $\alpha_n$ and $\beta_{n+1}$. Turbo decoders and their decoding methodology are well known. Any formulas or algorithms for calculating a forward matrix, a reverse matrix, and We decoder output, currently known or to be devised in the fixtures are applicable to the present invention. FIG. 1 is a diagram illustrating forward and backward iterative calculations being performed on an encoded block of data according to the prior art.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
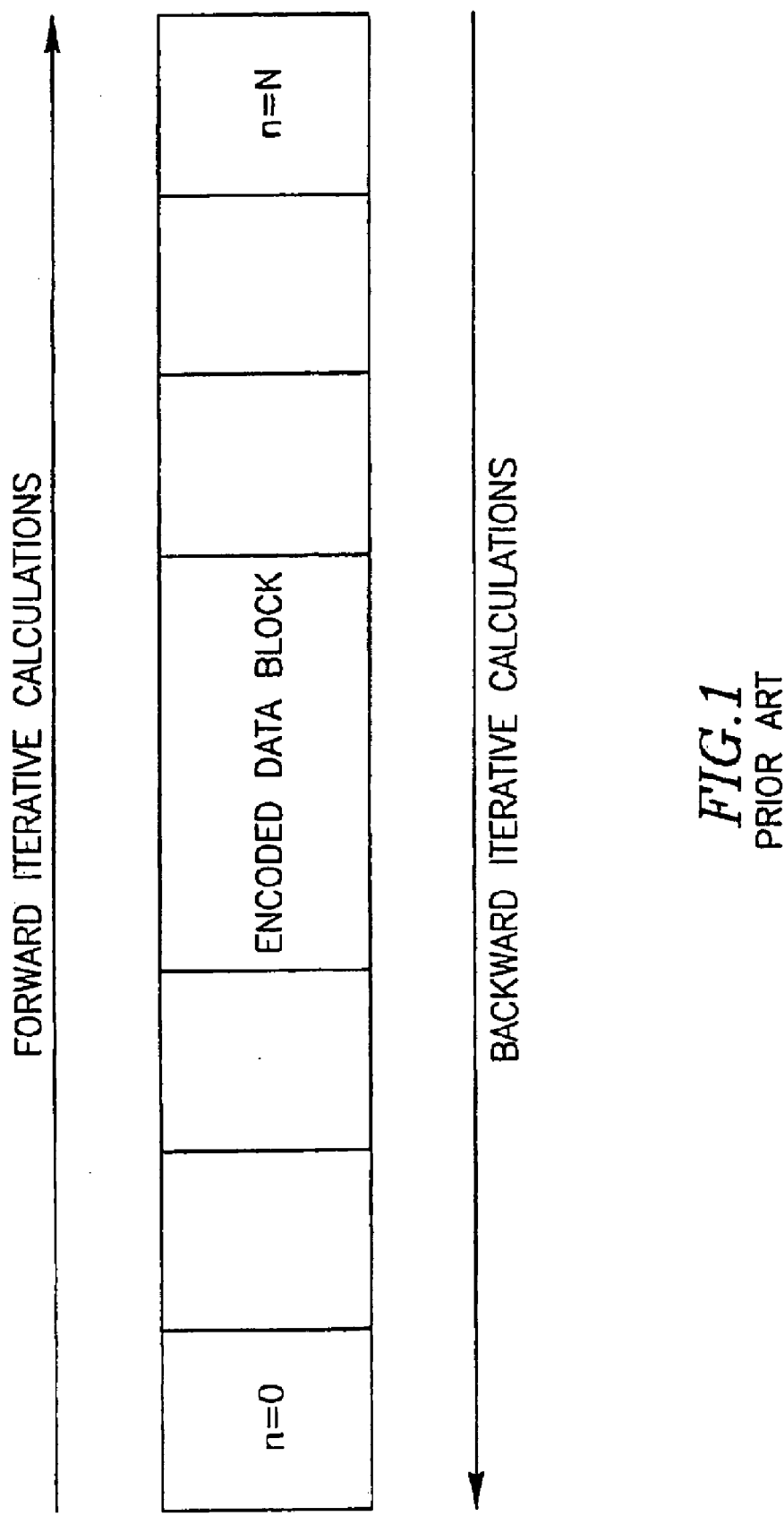
FIG. 1 is a diagram illustrating forward and backward iterative computations being performed on a block of encoded data according to the prior art.

It will be appreciated that for simplicity and clarity of illustration elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION

In the following detailed description, numerous specific details are set forth ill order to provide a thorough understanding of the invention. However, it will be understood by those skilled in the art that the present invention may be practiced without these specific details. In other instances, well-known methods, procedures, components and circuits have not been described in detail so as not to obscure the present invention.

Unless specifically stated otherwise, as apparent from the following discussions, it is appreciated that throughout the specification discussions utilizing terms such as "processing", "computing", "calculating", "determining", or the like, refer to the action and/or processes of a computer or computing system, or similar electronic computing device, that manipulate and/or transform data represented as physical, such as electronic, quantities within the computing system's registers and/or memories into other data similarly represented as physical quantities within the computing system's memories, registers or other such information storage, transmission or display devices.

Embodiments of the present invention may include apparatuses for performing the operations herein. This apparatus may be specially constructed for the desired purposes, or it may comprise a general purpose computer selectively activated or reconfigued by a computer program stored in the computer. Such a computer program may be stored in a computer readable storage medium, such as, but is not limited to, any type of disk including floppy disks, optical disks, CD-ROMs, magnetic-optical disks, read-only memories (ROMs), random access memories (RAMs) electrically programmable read-only memories (EPROMs), electrically erasable and programmable read only memories (EEPROMs), magnetic or optical cards, or any other type of media suitable for storing electronic instructions, and capable of being coupled to a computer system bus.

The processes and displays presented herein are not inherently related to any particular computer or other apparatus. Various general purpose systems may be used with programs in accordance with the teachings herein, or it may prove convenient to construct a more specialized apparatus to perform the desired method. The desired structure for a variety of these systems will appear from the description below. In addition, embodiments of the present invention are not described with reference to any particular programming language. It will be appreciated that a variety of programming languages may be used to implement the teachings of the inventions as described herein.

As part of the present invention a block of encoded data may be partitioned into two or more sub-blocks. A sub-block may be decoded by performing a forward iterative calculation and a backward iterative calculation, wherein the sub-block's backward iterative calculation may be partially based on a backward iterative calculation of a portion of a subsequent sub-block. Each sub-block may be partitioned further into sub-block segments. Each sub-block or sub-block segment may be decoded by a separate tread or process running on one or more general purpose processors or on a digital signal processors ("DSP").

A common memory may be shared by two processes decoding two separate sub-blocks or sub-block segments. As one process performs a second phase of iterative calculations on a sub-block, the process may release a portion of the memory, which portion may be used by a second process performing a first phase of iterative calculations on a second sub-block or sub-block segment. The processes sharing a memory may be running on one or more processors or DSP.

It should be understood that the term forward iterative calculations and backward iterative calculations are interchangeable. Since the terms forward and backward are relative terms, the terms forward iterative calculations and backward iterative calculations are interchangeable depending only upon the selection of a data block's start point and end point.

Figure 2:
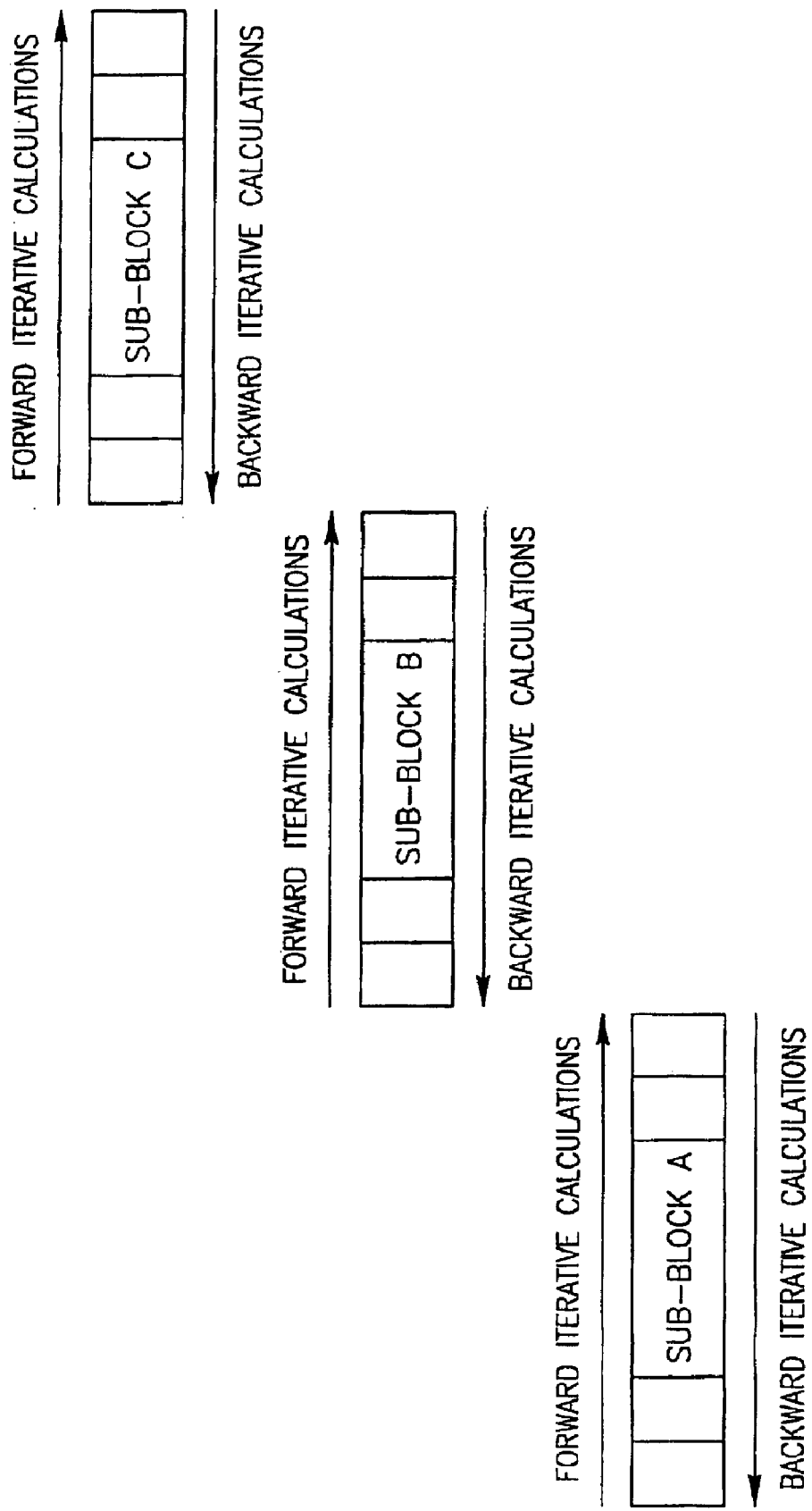
FIG. 2 is a diagram illustrating forward and backward iterative computations being performed on a first and second sub-block of encoded data in accordance with the present invention.

Turning now to FIG. 2, there is shown an encoded data block partitioned into two or more separate and adjacent sub-blocks of length L1. According to the example in FIG. 2, the first sub-block, Sub-Block A, may be decoded by first performing forward iterative calculations on the elements starting from the left, where n=0. The first sub-block may have a length L1, and the forward iterative calculation may proceed until n=L1A. The product of the forward iterative calculations may be referred to a forward state coefficients, $\alpha_n$, which collectively may be referred to as a forward state matrix. Tile forward state matrix may be stored in a temporary memory. As a second step, backward iterative calculations may be performed on the first sub-block, starting from the right and moving to the left. Since the backward iterative calculations for the first sub-block may require results of iterative operations starting in the second sub-block, Sub-Block B, the backward iterative calculations for the first sub-block may start at some point within the second sub-block, n=L1A+L2B. The order in which the forward and backward iterative calculations are performed are not relevant. A backward state matrix may be calculated and/or stored in a temporary memory prior to the calculation of a forward state matrix.

As coefficients for the backward iterative calculations are calculated, $\beta_n$, the output of the decoder may also be calculated using the already stored $\alpha_n$ coefficients, where the output is some function of $\alpha_n$ and $\beta_n$. Once the coefficients in a portion of temporary memory are used to calculate the decoder's output, that portion of memory may be released.

The second sub-block of encoded data, Sub-Block B, may be decoded by performing forward iterative calculations on the elements, as performed for the first sub-block. Backward iterative calculations for the second sub-block may start at a point within a third sub-block, Sub-Block C. In the event the block is only partitioned into two sub-blocks, the backward calculation for the second sub-block may either start at element N, the last element in the block, or at some point in the first sub-block of a subsequent block of encoded data.

Figure 3:
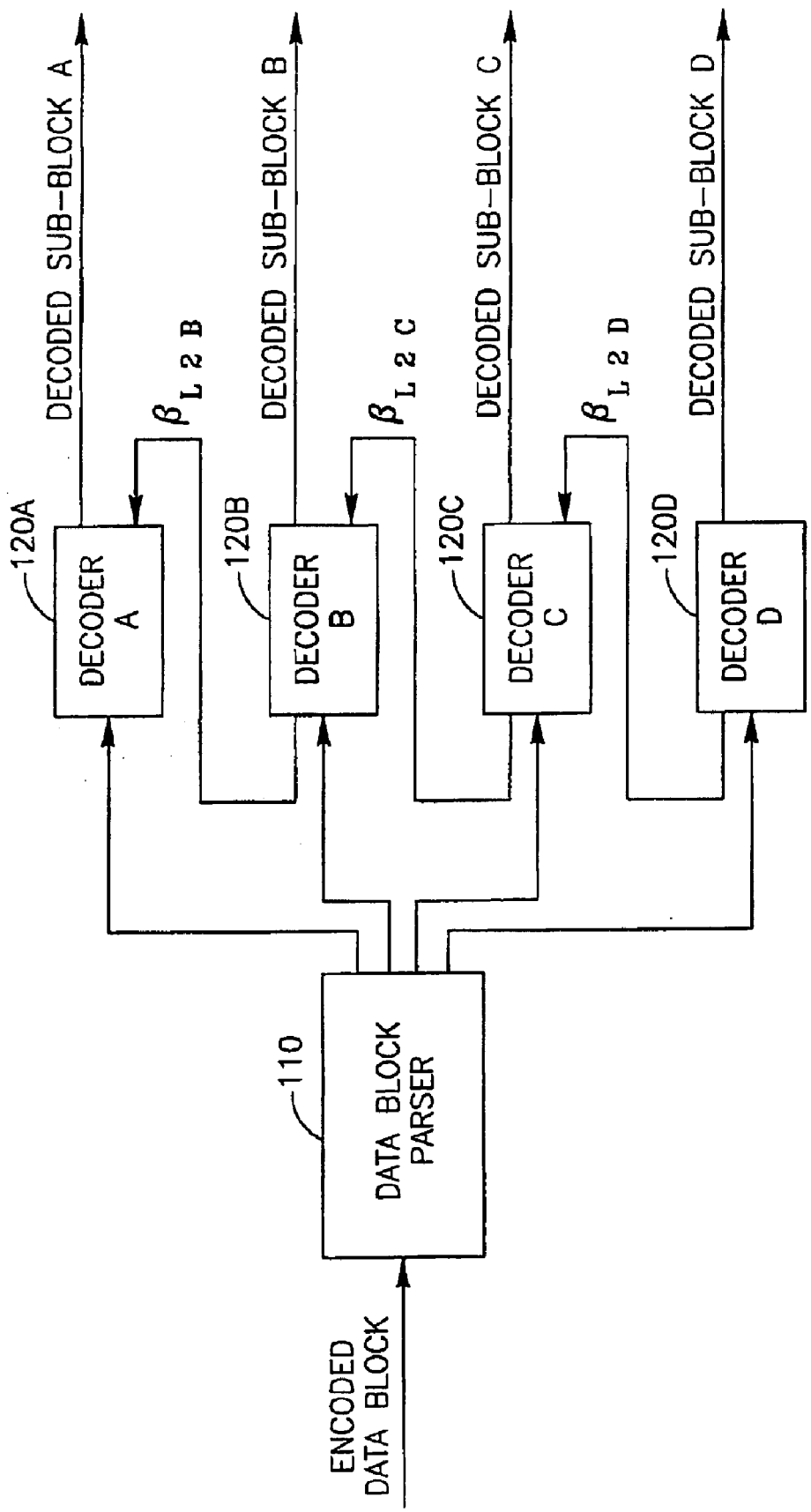
FIG. 3 is a diagram illustrating forward and backward iterative computations being performed on multiple sub-blocks by separate decoders.

Turning now to FIG. 3, there is shown a diagram of an encoded data block being parsed into sub-blocks by a data block parser 110, which sub-blocks may then be processed or decoded by separate decoders 120A to 120D. The parser 110 and the decoders 120A–120D may be separate processes running on a single processor or DSP. In another embodiment the decoders 120A to 120D may reside on physically distinct processing units. FIG. 3 also illustrates how one decoder may communicate to another decoder portions of a backward state matrix calculated by that decoder. As described above, portions of a backward state matrix of one sub-block may be used to calculate a backward state matrix of a previous sub-block.

Figure 4:
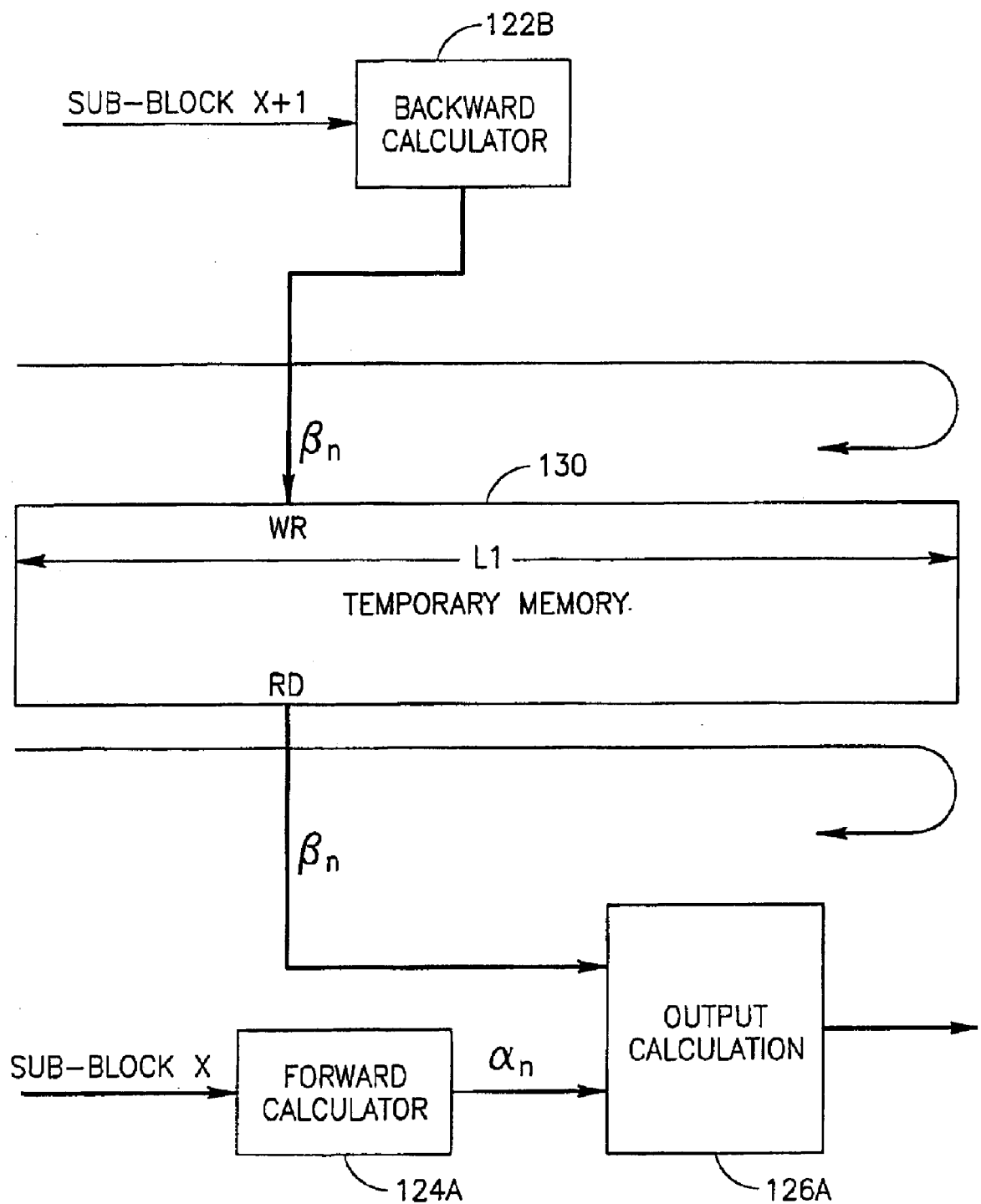
FIG. 4 is a diagram showing a temporary memory being shed by a decoder performing forward iterative calculations and a decoder performing backward iterative calculations.

Turning now to FIG. 4, there is shown a diagram illustrating an example of how a temporary memory 130 may be shared between two decoders decoding separate sub-blocks. According to the example in FIG. 4, as forward calculator 124A, from decoder 120A, calculates elements of a forward state matrix, $\alpha_n$, an output calculator 126A may read from the temporary memory 130 coefficients of sub-block X's previously calculated backward state matrix $\beta_n$ and may calculate sub-block X's output matrix. As the output calculator 126A reads $\beta_n$ from the left bit to the right bit of the temporary memory, portions of the memory block 130 are freed up and may be used by a backward state matrix calculator 122B of a second decoder 120B to store other state matrix coefficients. FIG. 4 shows a backward calculator which may perform a backward iterative calculation on sub-block X+1 and may store coefficients of the sub-block's backward state matrix in the portions of the temporary memory freed up, from left to right. Analogous memory sharing between the backward calculator and the forward calculator may be achieved in both directions. That is, the output calculator may read the coefficients from right to left and either the forward or backward calculator may write to the portions of memory being released, also from right to left. Which calculations are performed first, forward or backward iterative, may not be relevant.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed:

1. A method of decoding an encoded block of data comprising:
    partitioning the block into a first and a second sub-block assigned to a first and second process respectively; and
    performing backward iterative calculations on the first sub-block within some point of a second portion of the second sub-block based on results from backward iterative calculations on a first portion of the second sub-block.

2. The method according to claim 1, further comprising:
    performing forward iterative calculations on the first sub-block.

3. The method according to claim 2, further comprising: calculating a first output based on the results of the forward and backward iterative calculations performed on the first sub-block.

4. The method according to claim 3, further comprising:
    performing forward and backward iterative calculations on the second sub-block and calculating a second output based on the results of the forward and backward iterative calculations on the second block.

5. The method according to claim 4, further comprising: combining the first and second outputs into a single data black.

6. The method according to claim 4, further comprising: storing the results of the iterative calculation of the second sub-block on a temporary memory on which results from the iterative calculation of the first sub-block are stored.

7. The method according to claim 6, wherein results from the iterative calculations on the second sub-block are stored to a portion of the temporary memory after an output based on results stored in that portion of memory is calculated.

8. A decoder comprising:
    a processing unit to start to perform a backward iterative calculation on a first sub-block within some point of a second portion of the second sub-block, based on results of a backward iterative calculation performed by a second processing unit on a first portion of a second sub-block.

9. The decoder according to claim 8, wherein said processing unit is adapted to perform forward iterative calculations on the first sub-block.

10. The decoder according to claim 9, wherein said processing unit is adapted to calculate an output for the first sub-block based on the forward and backward iterative calculations for the sub-block.

11. The decoder according to claim 10, wherein said second processing unit is to perform backward and forward iterative calculations of the second sub-block and to calculate an output for the second sub-block based on results from the forward and backward calculations on the second sub-block.

12. The decoder according to claim 11, wherein the processing unit comprises:
a forward iterative calculator, a backward iterative calculator and an output calculator.

13. The decoder according to claim 12, further comprising:
a temporary memory.

14. The decoder according to claim 13, wherein said temporary memory is configured to store the results of iterative calculations on a first sub-block and then the results of iterative calculations on a second sub-block.

15. The decoder according to claim 14, wherein portions of said temporary memory are freed up as an output of the first sub-block is calculated.

16. The decoder according to claim 15, wherein results from iterative calculations on the second sub-block are stored in the freed portion of said temporary memory.

17. An apparatus comprising:
a data block parser to parse an encoded data block into at least first and second sub-blocks;
at least first and second processing units to perform forward and backward decoding at least on the first and second sub-blocks, respectively, of the encoded data block wherein, the backward decoding of the first sub-block is able to start within iterative calculations of the second sub-black; and
a memory to store outputs of at least the first and second processing units.

18. The apparatus of claim 17, wherein the first processing unit is able to perform a backward iterative calculation on at least a portion of the first sub-block based on results of a backward iterative calculation performed by the second processing unit on at least a portion of the second sub-block.

19. The apparatus of claim 18, wherein the first processing unit is able to perform forward iterative calculations on at least a portion of the first sub-block.

20. The apparatus of claim 19, wherein the first processing unit is able to decode the first sub-block and to provide an output based on the forward and backward iterative calculations preformed on the first sub-block.

21. The apparatus of claim 18, wherein the second processing unit is able to perform backward and forward iterative calculations of the second sub-block and to provide an output based on results from the forward and backward calculations preformed on the second sub-block.

22. The apparatus of claim 17, wherein the memory is able to store the results of the iterative calculations preformed on the first sub-block and the results of the iterative calculations preformed on the second sub-block.

23. The apparatus of claim 22, wherein portions of the memory are freed up as an output of the first sub-block is calculated.

24. The apparatus of claim 23, wherein results output from iterative calculations on the second sub-block are stored in the freed up portions of the memory.

25. The apparatus of claim 17, wherein the first and second sub-blocks are partitioned into two or more sub-block segments.

26. The apparatus of claim 25, wherein at least some of the sub-block segments are decoded by a separate thread and/or separate process running on one of the processing unit.

27. The apparatus of claim 25, wherein at least some of the sub-block segments are decoded by a separate thread and/or separate process running on a digital signal processor.

28. A method comprising:
parsing an encoded data block into first and second sub-blocks; and
performing a forward and backward decoding on the first and second sub-blocks by decoders of first and second processing units wherein, the backward decoding of the first sub-block is able to start within iterative calculations of a portion of the second sub-block.

29. The method of claim 28, further comprising:
performing a backward iterative calculation an the first sub-block based on results of a backward iterative calculation performed on at least a portion of the second sub-block.

30. The method of claim 28, wherein performing a forward and backward decoding on the first and second sub-blocks comprises decoding sub-block segments by a separate thread and/or separate process.

31. The method of claim 28, further comprising:
storing the results output from iterative calculations on a first sub-block and the results output from iterative calculations on a second block.

32. The method of claim 31, wherein storing comprises:
freeing up portions of a memory as an output of the first sub-block is calculated; and
storing results output from iterative calculations on the second sub-block in the freed up portion of the memory.

* * * * *